(12) United States Patent
Nogawa

(10) Patent No.: US 11,587,861 B2
(45) Date of Patent: Feb. 21, 2023

(54) SEMICONDUCTOR DEVICE AND MANUFACTURING METHOD THEREOF

(71) Applicant: FUJI ELECTRIC CO., LTD., Kawasaki (JP)

(72) Inventor: Hiroyuki Nogawa, Nagano (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 22 days.

(21) Appl. No.: 17/155,608

(22) Filed: Jan. 22, 2021

(65) Prior Publication Data

US 2021/0305144 A1 Sep. 30, 2021

(30) Foreign Application Priority Data

Mar. 30, 2020 (JP) .............................. JP2020-059883

(51) Int. Cl.
| | |
|---|---|
| *H01L 23/498* | (2006.01) |
| *H01L 23/00* | (2006.01) |
| *H01L 23/16* | (2006.01) |
| *H01L 23/29* | (2006.01) |
| *H01L 21/56* | (2006.01) |
| *H01L 23/053* | (2006.01) |
| *H01L 23/15* | (2006.01) |
| *H01L 21/48* | (2006.01) |

(52) U.S. Cl.
CPC .... *H01L 23/49844* (2013.01); *H01L 21/4853* (2013.01); *H01L 21/56* (2013.01); *H01L 23/053* (2013.01); *H01L 23/15* (2013.01); *H01L 23/16* (2013.01); *H01L 23/296* (2013.01); *H01L 24/29* (2013.01); *H01L 24/32* (2013.01); *H01L 24/83* (2013.01); *H01L 2224/29139* (2013.01); *H01L 2224/29147* (2013.01); *H01L 2224/32225* (2013.01); *H01L 2224/83203* (2013.01)

(58) Field of Classification Search
None
See application file for complete search history.

(56) References Cited

U.S. PATENT DOCUMENTS

| | | | | |
|---|---|---|---|---|
| 9,048,227 | B2 * | 6/2015 | Kimura | .............. H01L 23/3735 |
| 9,818,687 | B2 * | 11/2017 | Kanai | ..................... H01L 23/60 |
| 10,580,932 | B2 * | 3/2020 | Hayashi | ................ H01L 33/387 |
| 11,232,991 | B2 * | 1/2022 | Saito | ....................... H01L 23/36 |
| 2002/0052062 | A1 * | 5/2002 | Sakamoto | ............. H01L 21/568 |
| | | | | 257/E23.125 |

(Continued)

FOREIGN PATENT DOCUMENTS

| | | |
|---|---|---|
| CN | 109801900 A * | 5/2019 |
| CN | 110444536 A * | 11/2019 |

(Continued)

*Primary Examiner* — Telly D Green
(74) *Attorney, Agent, or Firm* — Rabin & Berdo, P.C.

(57) ABSTRACT

A semiconductor device including an insulating circuit board. The insulating circuit board has an insulating plate, a plurality of circuit patterns disposed on a front surface of the insulating plate, any adjacent two of the circuit patterns having a gap therebetween, each circuit pattern having at least one corner, each corner being in a corner area that covers the corner and a portion of each gap adjacent to the corner, and a buffer material containing resin, applied at a plurality of corner areas, to fill the gaps in the plurality of corner areas.

13 Claims, 11 Drawing Sheets

(56) References Cited

U.S. PATENT DOCUMENTS

| | | | |
|---|---|---|---|
| 2011/0309404 A1* | 12/2011 | Lee | H01L 33/60 |
| | | | 257/99 |
| 2014/0225238 A1* | 8/2014 | Kimura | H01L 23/495 |
| | | | 257/666 |
| 2017/0229389 A1* | 8/2017 | Katsuki | H01L 23/49894 |
| 2017/0236782 A1* | 8/2017 | Nonaka | H01L 25/072 |
| | | | 257/667 |
| 2018/0226324 A1* | 8/2018 | Kimura | H01L 23/5386 |
| 2018/0329002 A1* | 11/2018 | Lorenz | G01R 15/205 |
| 2019/0006272 A1* | 1/2019 | Kai | H05K 3/243 |
| 2019/0252289 A1* | 8/2019 | Nakahara | H01L 23/3735 |
| 2019/0273041 A1* | 9/2019 | Nishizawa | H01L 25/072 |
| 2019/0371705 A1* | 12/2019 | Yamauchi | H01L 23/3731 |
| 2020/0267845 A1* | 8/2020 | Wan Azha | H01L 21/4853 |

FOREIGN PATENT DOCUMENTS

| | | | | |
|---|---|---|---|---|
| EP | 1739740 A2 | | 1/2007 | |
| JP | 2002-076190 A | | 3/2002 | |
| JP | 2002-076197 A | | 3/2002 | |
| JP | 2007-012831 A | | 1/2007 | |
| JP | 2019012767 A | * | 1/2019 | H01L 21/481 |
| KR | 20180040073 A | * | 4/2018 | |
| WO | WO-2018135465 A1 | * | 7/2018 | H01L 23/053 |
| WO | WO-2018180580 A1 | * | 10/2018 | H01L 25/07 |
| WO | WO-2019159798 A1 | * | 8/2019 | H01L 21/4807 |

\* cited by examiner

SEMICONDUCTOR DEVICE AND MANUFACTURING METHOD THEREOF

CROSS-REFERENCE TO RELATED APPLICATIONS

This application is based upon and claims the benefit of priority of the prior Japanese Patent Application No. 2020-059883, filed on Mar. 30, 2020, the entire contents of which are incorporated herein by reference.

BACKGROUND OF THE INVENTION

1. Field of the Invention

The embodiments discussed herein relate to a semiconductor device and a manufacturing method thereof.

2. Background of the Related Art

Semiconductor devices include semiconductor chips and are used as power conversion devices. These semiconductor chips include, for example, insulated gate bipolar transistors (IGBTs) or power metal oxide semiconductor field effect transistors (MOSFETs). Such a semiconductor device has a case including at least semiconductor chips, external connection terminals, and an insulating circuit board on which the semiconductor chips and the external connection terminals are disposed. These parts inside the case of the semiconductor device are sealed by sealing material. The insulating circuit board includes an insulating plate and circuit patterns formed on the front surface of the insulating plate. The semiconductor chips and the external connection terminals are bonded to the front surfaces of the circuit patterns by solder. In addition, on the rear surface of the semiconductor device, the rear surface of a metal plate of the insulating circuit board is exposed (for example, see Japanese Laid-open Patent Publication No. 2007-012831). When a current flows through a semiconductor chip of the semiconductor device, the semiconductor chip generates heat. The heat generated by the semiconductor chip is transferred via the insulating circuit board and is released from the rear surface of the metal plate of the insulating circuit board.

However, the insulating plate, the circuit patterns, and the metal plate of the insulating circuit board each have a different linear expansion coefficient. When the heat generated by a semiconductor chip is transferred to the insulating circuit board, the insulating plate, the corresponding circuit pattern, and the metal plate expand differently depending on the differences among the linear expansion coefficients. Thus, stress occurs in the insulating circuit board. Accordingly, the circuit pattern could be peeled from the insulating plate or the insulating plate could be damaged by the stress. As a result, the reliability of the semiconductor device is deteriorated.

SUMMARY OF THE INVENTION

In one aspect of the embodiments, there is provided a semiconductor device including: an insulating circuit board, including an insulating plate, a plurality of circuit patterns disposed on a front surface of the insulating plate, the plurality of circuit patterns being arranged to have a gap between any adjacent two of the circuit patterns and to have an area between a whole circumferential part of the circuit patterns and an outer circumferential part of the insulating plate in a plan view of the semiconductor device, each circuit pattern having at least one corner, each corner being in a corner area that covers the corner and a portion of each gap adjacent to the corner, and a buffer material containing resin, applied at at least one of the corner areas, to fill the gap in the at least one of the corner areas.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, embodiments will be described with reference to the accompanying drawings. In the following description, regarding semiconductor devices 1 and 50 in FIGS. 1 and 3, "front surface" and "top surface" each mean a surface facing upwards. Likewise, regarding the semiconductor devices 1 and 50 in FIGS. 1 and 3, "up" means an upward direction. In addition, regarding the semiconductor devices 1 and 50 in FIGS. 1 and 3, "rear surface" and "bottom surface" each mean a surface facing downwards. Likewise, regarding the semiconductor devices 1 and 50 in FIGS. 1 and 3, "down" means a downward direction. In the other drawings as well, the above terms mean their respective directions, as needed. The terms "front surface", "top surface", "up", "rear surface", "bottom surface", "down", and "side surface" are used as convenient expressions to determine relative positional relationships and are not intended to limit the technical concepts of the embodiments.

For example, the terms "up" and "down" do not necessarily mean any vertical directions with respect to the ground. That is, the directions expressed by "up" and "down" are not limited to the directions relating to the gravity. In addition, in the following description, when the volume percent (vol %) of a component contained in material is 80 vol % or more, this component will be referred to as the "main component" of the material.

First Embodiment

Figure 1A:
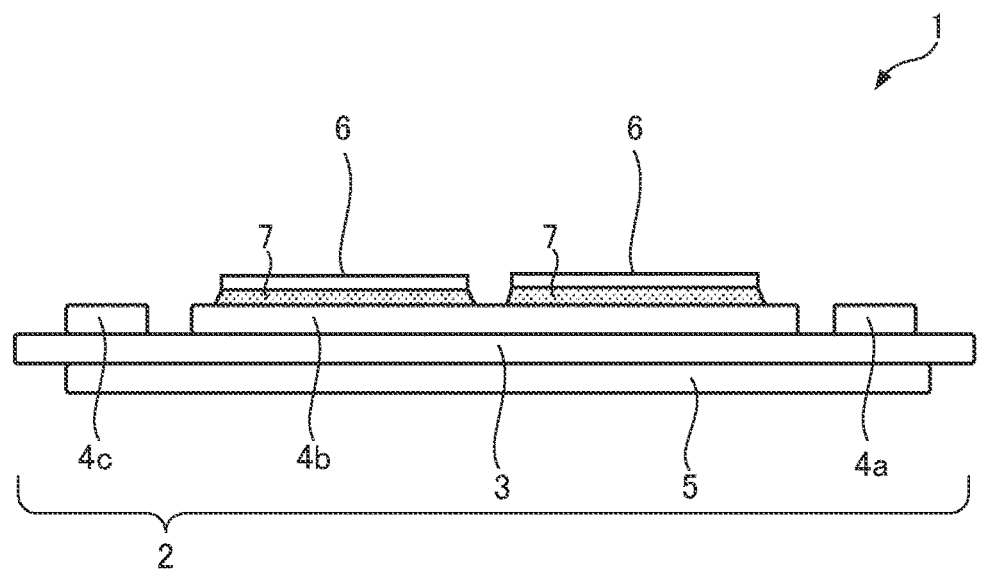
FIGS. 1A and 1B each illustrate a semiconductor device according to a first embodiment.
Figure 1B:
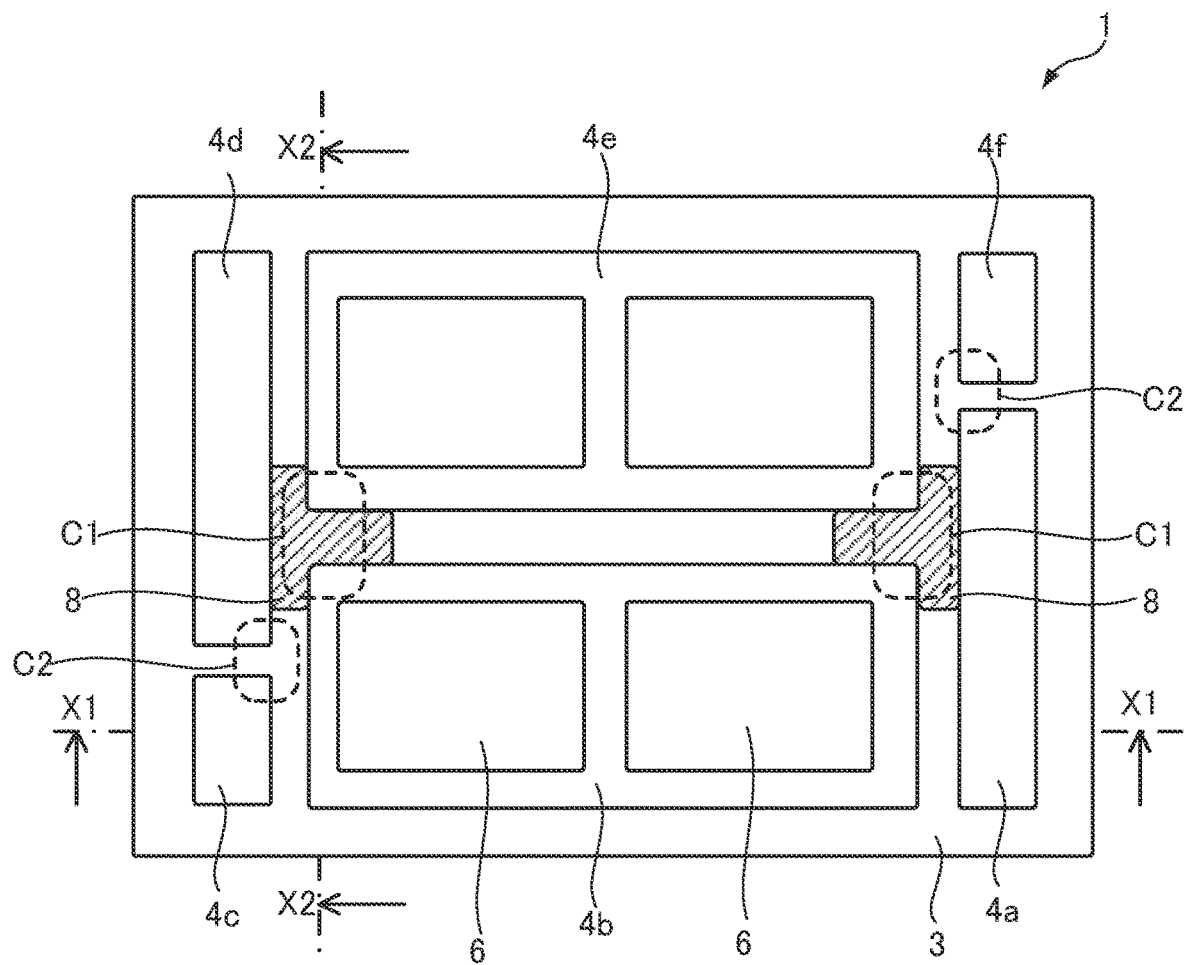
Figure 2A:
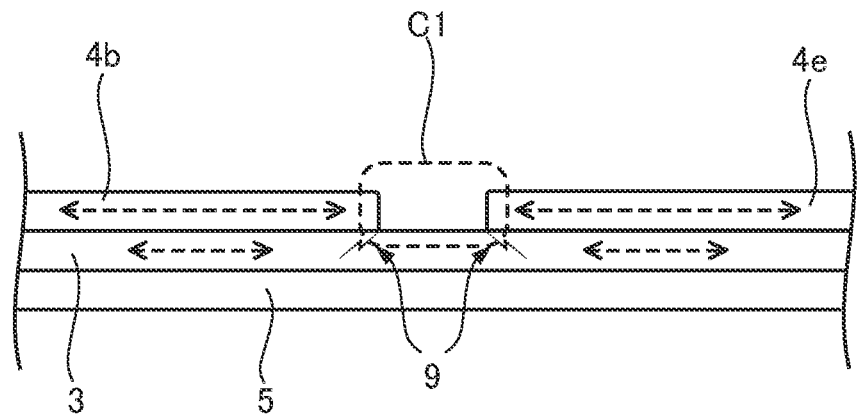
FIGS. 2A and 2B each illustrate a sectional view of a main part of the semiconductor device according to the first embodiment.
Figure 2B:
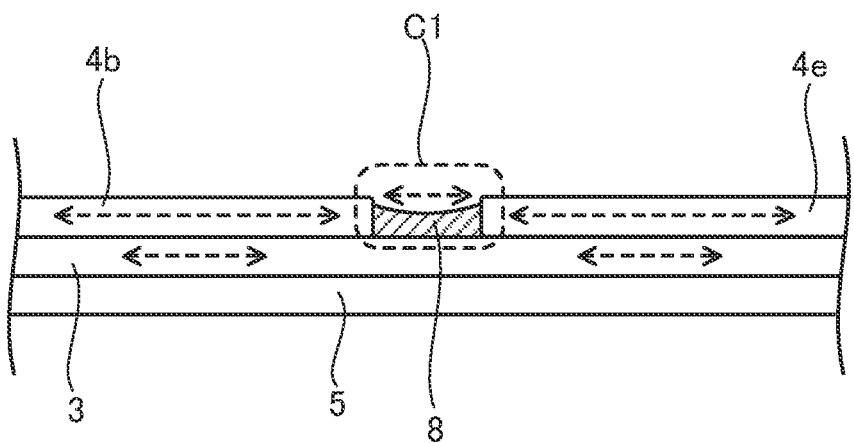

A semiconductor device according to a first embodiment will be described with reference to FIGS. 1A and 1B and FIGS. 2A and 2B. FIGS. 1A and 1B each illustrate the semiconductor device according to the first embodiment. FIG. 1A is a sectional view taken along a dashed-dotted line X1-X1 in FIG. 1B. FIGS. 2A and 2B are each a sectional view of a main part of the semiconductor device according to the first embodiment. FIGS. 2A and 2B are each a sectional view of a corner area (buffer applied area) C1 taken along a dashed-dotted line X2-X2 in FIG. 1B. More specifically, FIG. 2A illustrates, as a comparative example, the semiconductor device 1 without buffer material 8, and FIG. 2B illustrates the semiconductor device 1 in FIGS. 1A and 1B.

The semiconductor device 1 includes an insulating circuit board 2 and semiconductor chips 6. The insulating circuit board 2 includes an insulating plate 3, a plurality of circuit patterns 4a to 4f, each of which is formed with a gap from the other circuit patterns on the front surface of the insulating plate 3, and a metal plate 5 formed on the rear surface of the insulating plate 3. The insulating plate 3 is made of ceramic material, for example. The circuit patterns 4a to 4f are electrically conductive members made of metal material. The circuit patterns 4a to 4f and the metal plate 5 each have a larger linear expansion coefficient than that of the insulating plate 3. In addition, the semiconductor chips 6 are bonded to the circuit patterns (chip circuit patterns) 4b and 4e by bonding material 7.

The individual buffer material 8 contains resin and is applied in a gap at a corner area including a corner of any one of the circuit patterns 4a to 4f. In addition, it is preferable that the individual buffer material 8 be applied in a gap at a corner area further inside than the outer corners of the circuit patterns 4a to 4f, the outer corners facing the outer circumferential part of the insulating plate 3. This is because there are cases in which a case is attached to the outer circumferential part of the insulating plate 3 as needed. FIG. 1B illustrates a case in which the buffer material 8 is applied in gaps at corner areas C1 including corners of the circuit patterns 4b and 4e. The buffer material 8 may be applied in different areas, such as a gap at a corner area (buffer applied area) C2 including corners of the circuit patterns 4a and 4f and a gap at a corner area C2 including corners of the circuit patterns 4c and 4d. The buffer material 8 is applied in the above gaps in such a manner that the front surface of the buffer material 8 is lower than the front surfaces of the circuit patterns 4b and 4e (see FIG. 2B). If the front surface of the buffer material 8 applied in the gaps is above the front surfaces of the circuit patterns 4b and 4e, the buffer material 8 takes up some of the areas of the front surfaces of the circuit patterns 4b and 4e, and as a result, the areas of the front surfaces of the circuit patterns 4b and 4e are reduced. In contrast, if the front surface of the buffer material 8 is not sufficiently high in the gaps, the stress caused by the expansion and contraction of the circuit patterns 4b and 4e as will be described below is not suitably buffered. Thus, the buffer material 8 needs to be applied to up to a level, which is at least half of the depth of the gaps.

While not illustrated, external connection terminals may be bonded to any of the circuit patterns 4a to 4f of the semiconductor device 1 by using bonding material or contact parts.

Next, as a comparative example, a case in which the semiconductor device 1 does not include the buffer material 8 will be described with reference to FIG. 2A. When the individual semiconductor chips 6 of the semiconductor device 1 receive a current and are driven, the semiconductor chips 6 generate heat. The heat generated by the semiconductor chips 6 is transferred from the circuit patterns 4b and 4e to the insulating plate 3 and the metal plate 5 and is released from the rear surface of the metal plate 5. During this process, the circuit patterns 4b and 4e and the insulating plate 3 are heated and expanded. The circuit patterns 4b and 4e each have a linear expansion coefficient larger than that of the insulating plate 3. Thus, the circuit patterns 4b and 4e expand and contract more than the insulating plate 3. As a result, for example, as illustrated in FIG. 2A, stress is caused at the boundary between the circuit patterns 4b and 4e on the insulating plate 3, and cracks occur. If the circuit patterns 4b and 4e further expand and contract, cracks 9 occur within the insulating plate 3 from these cracks and extend into the insulating plate 3. In addition, due to these cracks, the circuit patterns 4b and 4e could be peeled from the insulating plate 3. If the insulating circuit board 2 is damaged in this way, the reliability of the semiconductor device 1 is deteriorated. Such damage could also be caused not only at the corner area C1 illustrated in FIG. 2A but also at any boundary between two of the circuit patterns 4a to 4f on the insulating plate 3. In particular, damage is more likely to be caused at the corner areas C1 and C2 around the circuit patterns 4a to 4f. In addition, since the semiconductor chips 6 are subjected to a large temperature change, damage is more likely to be caused at the corner areas C1 around the circuit patterns 4b and 4e.

Thus, in the case of the semiconductor device 1 according to the first embodiment, the buffer material 8 is applied in the gaps at the corner areas C1 around the circuit patterns 4b and 4e. In this case, too, as in FIG. 2A, as the semiconductor chips 6 are heated, the circuit patterns 4b and 4e and the insulating plate 3 expand. As described above, the circuit patterns 4b and 4e each have a linear expansion coefficient larger than that of the insulating plate 3. When the circuit patterns 4b and 4c begin to expand more than the insulating plate 3 does, the buffer material 8 buffers the stress caused by the expansion of the circuit patterns 4b and 4c, as illustrated in FIG. 2B. Thus, the stress caused at the boundary of the circuit patterns 4b and 4e on the insulating plate 3 is reduced, and the occurrence of cracks is consequently reduced. If the occurrence of cracks is reduced, the occurrence of the cracks 9 into the insulating plate 3 from the cracks and the peeling of the circuit patterns 4b and 4e from the insulating plate 3 due to the cracks are prevented. Thus, it is possible to prevent the insulating circuit board 2 from being damaged and to reduce the deterioration of the reliability of the semiconductor device 1. In addition, the buffer material 8 may be applied to the corner areas C2 or all the gaps around the circuit patterns 4a to 4f. The same advantageous effects are obtained in this way as well.

The above semiconductor device 1 includes the insulating circuit board 2, which includes the insulating plate 3 and the plurality of circuit patterns 4a to 4f, each of which is formed with a gap from the other circuit patterns on the front surface of the insulating plate 3. In addition, the buffer material 8 containing resin is applied in the gaps at the corner areas C1 including corners of the circuit patterns 4b and 4e on which the semiconductor chips 6 are disposed. In this connection, the corner areas C1 each include inner corners of the circuit patterns 4b and 4e located further inside than the outer corners of the circuit patterns 4b and 4e facing the outer circumferential part of the insulating plate 3. The buffer material 8 buffers the stress caused by the expansion of the circuit patterns 4b and 4e due to the heat generated by the semiconductor chips 6. Thus, since the stress caused at the boundary between the circuit patterns 4b and 4e on the insulating plate 3 is reduced, the occurrence of cracks is reduced. Thus, it is possible to prevent the insulating circuit board 2 from being damaged and to reduce the deterioration of the reliability of the semiconductor device 1. In addition, it is preferable that the buffer material 8 not be applied at the outer corners at which cracks due to stress relatively rarely occur and to which a member such as a case is joined. Furthermore, the heat generated by the semiconductor chips 6 may cause stress that cracks the insulating circuit board 2 and other circuit patterns 4a, 4c, 4d and 4f on which the semiconductor chips 6 are not disposed via wiring members and a sealing material, not illustrated. To prevent this, the buffer material 8 may be applied in the gaps at the corner areas C2 that include inner corners of the plurality of circuit patterns 4a, 4c, 4d, and 4f on which the semiconductor chips 6 are not disposed, in addition to the gaps at the corner areas C1. Alternatively, the buffer material 8 may be applied in all gaps between any adjacent two of the plurality of circuit patterns 4a to 4f. These cases as well produce the same advantageous effects.

Second Embodiment

Figure 3:
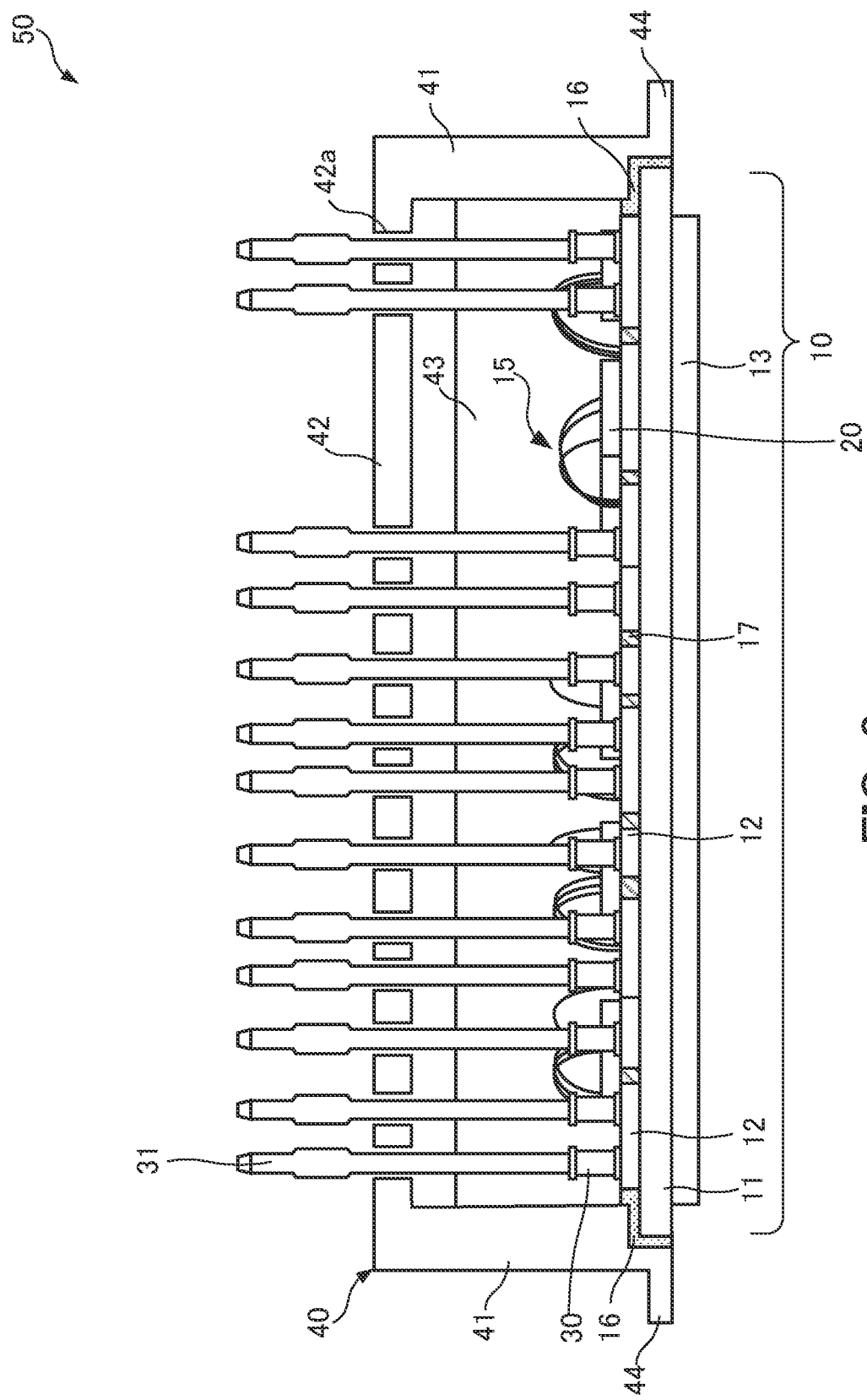
FIG. 3 is a sectional view of a semiconductor device according to a second embodiment.
Figure 4:
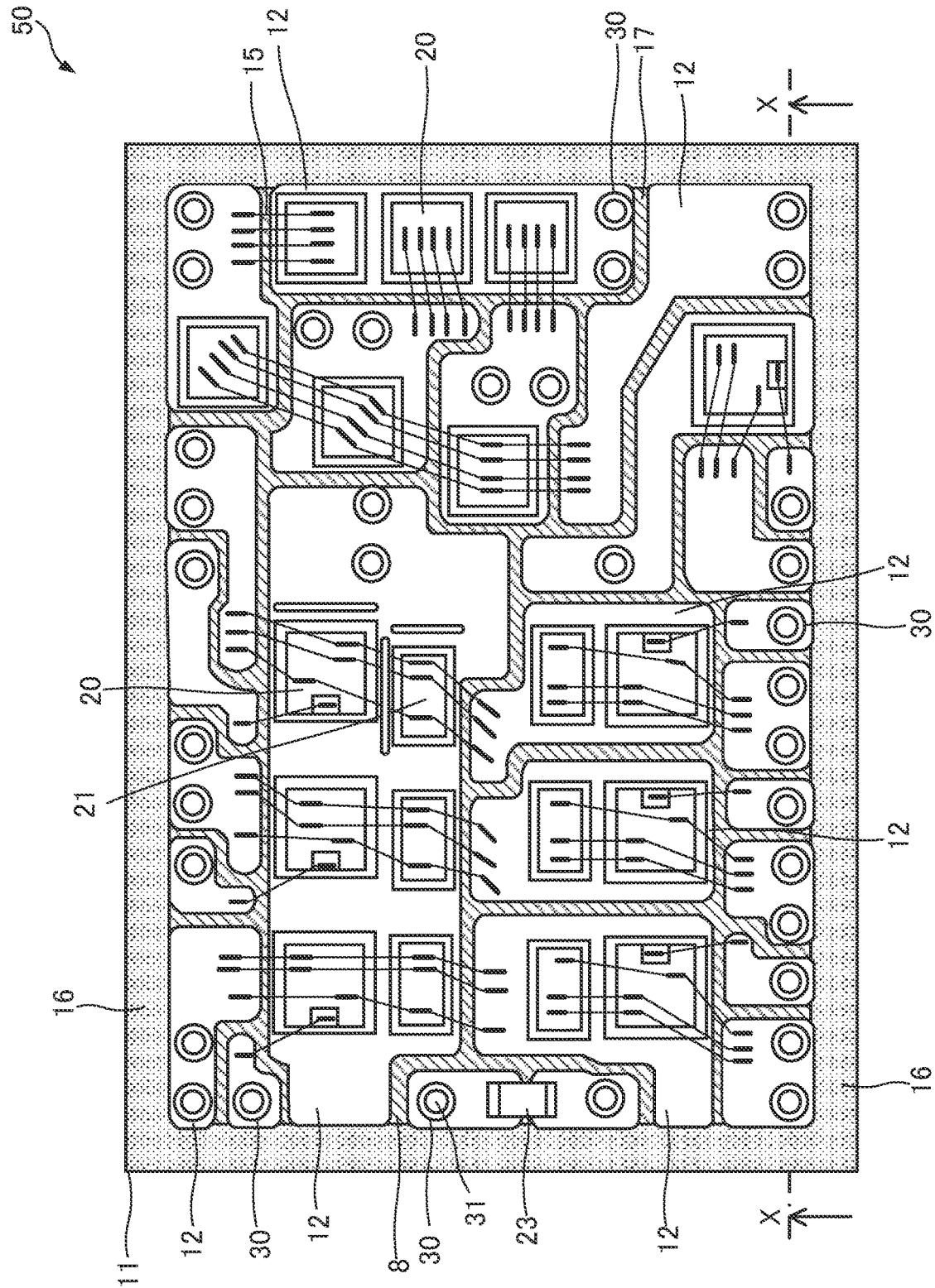
FIG. 4 is a plan view of a ceramic circuit board included in the semiconductor device according to the second embodiment.

A semiconductor device according to a second embodiment will be described with reference to FIGS. 3 and 4. FIG. 3 is a sectional view of the semiconductor device according to the second embodiment, and FIG. 4 is a plan view of a ceramic circuit board included in the semiconductor device according to the second embodiment. FIG. 3 is a sectional view taken along a dashed-dotted line X-X in FIG. 4. A case 40 is not illustrated in FIG. 4. In addition, in the second embodiment, a plurality of circuit patterns 12 are collectively given the same reference numeral, and so are a plurality of first semiconductor chips 20, a plurality of second semiconductor chips 21, a plurality of contact parts 30, a plurality of external connection terminals 31, and a plurality of bonding wires 15. Note that a plurality of constitutional components of the same type, other than these, are collectively given the same reference numeral and will be described without distinction among them.

As illustrated in FIGS. 3 and 4, this semiconductor device 50 includes a ceramic circuit board 10 (an insulating circuit board) and the first and second semiconductor chips 20 and 21 bonded to the front surface of the ceramic circuit board 10. The contact parts 30 are bonded on the front surface of the ceramic circuit board 10 of the semiconductor device 50. The first and second semiconductor chips 20 and 21 and the contact parts 30 are bonded to the front surface of the ceramic circuit board 10 via bonding material (not illustrated). The bonding material will be described below.

The semiconductor device 50 includes the bonding wires 15 that electrically connect the front surface of the ceramic circuit board 10 and main electrodes of the first and second semiconductor chips 20 and 21. In addition, the external connection terminals 31 are pressed into the contact parts 30. In the case of this semiconductor device 50, the ceramic circuit board 10, the first and second semiconductor chips 20 and 21, the contact parts 30, the external connection terminals 31, the bonding wires 15, etc. are covered by the case 40. The external connection terminals 31 protrude upward through insertion holes 42a in the case 40. In addition, the first and second semiconductor chips 20 and 21, the bonding wires 15, and the contact parts 30 on the front surface of the ceramic circuit board 10 are sealed by sealing material 43 in the case 40, and tip parts of the external connection terminals 31 attached to the contact parts 30 protrude from the case 40.

The ceramic circuit board 10 has a rectangular shape in plan view. The ceramic circuit board 10 includes a ceramic board 11, a metal plate 13 formed on the rear surface of the ceramic board 11, and the plurality of circuit patterns 12 formed on the front surface of the ceramic board 11. The ceramic board 11 and the metal plate 13 have a rectangular shape in plan view. Each of the corners of the ceramic board 11 and the metal plate 13 may be chamfered into a rounded or beveled shape. The metal plate 13 is smaller in size than the ceramic board 11 in plan view and is formed on the inner side of the ceramic board 11. The ceramic board 11 is made of ceramic material having good thermal conductivity. This ceramic material contains aluminum oxide, aluminum nitride, silicon nitride, or the like as its main component. The ceramic board 11 has a thickness between 0.5 mm and 2.0 mm, inclusive. For example, the ceramic board 11 has a linear expansion coefficient between $3 \times 10^{-6}$(1/° C.) and $7 \times 10^{-6}$(1/° C.), inclusive.

The plurality of circuit patterns 12 are made of metal material having excellent electrical conductivity. Examples of the metal material include silver, copper, nickel, and an alloy containing at least one kind of these elements. The individual circuit pattern 12 has a thickness between 0.5 mm and 1.5 mm, inclusive. The individual circuit pattern 12 has a linear expansion coefficient between $15 \times 10^{-6}$ (1/° C.) and $17 \times 10^{-6}$ (1/° C.), inclusive. To improve the corrosion resistance, plating may be performed on the front surface of the individual circuit pattern 12. The plating material used in this plating is, for example, nickel, a nickel-phosphorus alloy, or a nickel-boron alloy. The plurality of circuit patterns 12 are formed on the ceramic board 11 by forming a metal layer on the front surface of the ceramic board 11 and performing etching or the like on this metal layer. Alternatively, a plurality of circuit patterns 12, which have previously been cut out from a metal layer, may be press-bonded to the front surface of the ceramic board 11. In this way, each circuit pattern 12 is formed with a gap from the other circuit patterns 12 on the front surface of the ceramic board 11. The individual gap is, for example, between 100 μm and 5 mm, inclusive. In addition, each of the corners of the individual circuit pattern 12 is chamfered into a rounded shape. In addition, there is an area between the whole circumferential part of the plurality of circuit patterns 12 and the outer circumferential part of the ceramic board 11. The whole circumferential part of the plurality of circuit patterns 12 faces the outer circumferential part of the ceramic board 11. As illustrated in FIGS. 3 and 4, adhesive 16 to be described below is applied to this area. The plurality of circuit patterns 12 illustrated in FIGS. 3 and 4 are examples. The number of circuit patterns 12 and the shapes and the sizes of the circuit patterns 12 may be suitably set, depending on the need.

The metal plate 13 is made of metal material having excellent thermal conductivity. The individual corner of the metal plate 13 is chamfered into a rounded shape. Examples of the metal material include aluminum, iron, silver, copper, and an alloy containing at least one kind of these elements.

In addition, the metal plate 13 has a thickness between 0.1 mm and 2.0 mm, inclusive. To improve the corrosion resistance, plating may be performed on the front surface of the metal plate 13. The plating material used in this plating is, for example, nickel, a nickel-phosphorus alloy, or a nickel-boron alloy. The metal plate 13 has a linear expansion coefficient between $15 \times 10^{-6} (1/°\text{ C.})$ and $17 \times 10^{-6} (1/°\text{ C.})$, inclusive.

For example, a direct copper bonding (DCB) board or an active metal brazed (AMB) board may be used as the ceramic circuit board 10 having the above configuration. In the case of the semiconductor device 50, while the above components in the case 40 are sealed by the sealing material 43, the rear surface of the metal plate 13 of the ceramic circuit board 10 is exposed to the outside. Heat-conductive materials are formed on the exposed rear surface of the metal plate 13 of the ceramic circuit board 10. A heat radiation unit (not illustrated) is attached to the rear surface via the heat-conductive materials. This further improves the heat radiation performance of the semiconductor device 50. The individual heat-conductive material is thermal interface material (TIM), which refers to a generic term for various kinds of material such as thermally conductive grease, elastomer sheet, room temperature vulcanization (RTV) rubber, gel, and phase change material.

In addition, the adhesive 16 is applied to at least corner areas including the outer corners of the plurality of circuit patterns 12, the corner areas facing the outer circumferential part of the ceramic board 11. FIG. 4 illustrates a case in which the adhesive 16 is applied to the entire area from the whole circumferential part of the plurality of circuit patterns 12 to the outer circumferential part of the ceramic board 11 and the entire side surfaces of the ceramic board 11. The adhesive 16 may contain thermosetting resin as its main component. Such resin is excellent in adhesion and flexibility after hardened. It is preferable that the elastic modulus be 1 GPa or less. Such adhesive 16 contains silicone as its main component, for example.

In addition, buffer material 17 is applied in all the gaps among the plurality of circuit patterns 12. As in the first embodiment, the front surface of the buffer material 17 is below the front surfaces of the plurality of circuit patterns 12 and is above the half of the gap depth. The buffer material 17 has a linear expansion coefficient between $12 \times 10^{-6} (1/°\text{ C.})$ and $14 \times 10^{-6} (1/°\text{ C.})$, inclusive, and has an elastic modulus between 14 GPa and 20 GPa, inclusive. Resin is used for the buffer material 17. It is preferable that the glass transition temperature of the resin be, for example, 200° C. or higher, in terms of manufacturing the semiconductor device 50. The resin is, for example, epoxy resin.

The individual first semiconductor chip 20 is a switching element made of silicon or silicon carbide. The individual first semiconductor chip 20 has a shape of a flat plate and is rectangular in plan view. The individual switching element is, for example, an IGBT or a power MOSFET. When a first semiconductor chip 20 is an IGBT, the first semiconductor chip 20 includes a collector electrode rectangular in plan view on its rear surface as a main electrode. In addition, the first semiconductor chip 20 includes a gate electrode rectangular in plan view on a center part of one end part and an emitter electrode as a main electrode in an area where the gate electrode is not formed on its front surface. When a first semiconductor chip 20 is a power MOSFET, the first semiconductor chip 20 includes a drain electrode rectangular in plan view on its rear surface as a main electrode. In addition, the first semiconductor chip 20 includes a gate electrode rectangular in plan view on a center part of one end part and a source electrode as a main electrode in an area where the gate electrode is not formed on its front surface. The individual second semiconductor chip 21 is a diode element made of silicon or silicon carbide. The individual second semiconductor chip 21 has a shape of a flat plate and is rectangular in plan view. The diode element is, for example, a free wheeling diode (FWD) such as a Schottky barrier diode (SBD) or a P-intrinsic-N (PiN) diode. The individual second semiconductor chip 21 includes a cathode electrode rectangular in plan view as a main electrode on its rear surface and an anode electrode rectangular in plan view as a main electrode on its front surface.

Each of the main electrodes and gate electrodes of the first and second semiconductor chips 20 and 21 is thin film made of metal material, which contains aluminum, copper, or an alloy containing at least one of these elements as its main component. The rear surfaces of the first and second semiconductor chips 20 and 21 are bonded to predetermined circuit patterns 12 via bonding material (not illustrated). Sintered body or solder is used for the bonding material. Any sintered body may be used as long as its sintering temperature is lower than the glass transition temperature of the buffer material 17. The metal particulate powder used in this case contains, for example, silver, copper, or an alloy containing at least one kind of these elements as its main component. Any solder may be used as long as its melting temperature is lower than the glass transition temperature of the buffer material 17. For example, lead-free solder is used as such solder. For example, the lead-free solder has at least one of an alloy of tin, silver, and copper, an alloy of tin, zinc, and bismuth, an alloy of tin and copper, and an alloy of tin, silver, indium, and bismuth as its main component. The solder may contain an additive, which is for example, nickel, germanium, cobalt, or silicon. Such addition of an additive to the solder improves the wettability, the luster, and the bonding strength, and as a result, the reliability is also improved. The present embodiment assumes that sintered body is used as the bonding material. For example, each of the first and second semiconductor chips 20 and 21 has a thickness between 180 μm and 220 μm, inclusive, and the average thickness is about 200 μm. An electronic part 23 may be disposed on circuit patterns 12 via the above bonding material so that the semiconductor device 50 is able to achieve a desired function. For example, a thermistor, a current sensor, or the like is used as the electronic part 23, depending on the function. The electronic part 23 may be any element as long as the element has a size large enough to stretch over a pair of circuit patterns 12 illustrated in FIG. 4 and is smaller than this pair of circuit patterns 12, for example.

The bonding wires 15 electrically connect the gate electrodes and main electrodes on the front surfaces of the first and second semiconductor chips 20 and 21 to the circuit patterns 12 or electrically connect the main electrodes of the plurality of first and second semiconductor chips 20 and 21 to each other, as needed. These bonding wires 15 bond the above elements so that their arch-like bulge has a predetermined height. As needed, stitch bonding is performed so that a bonding wire 15 continuously connects three or more locations. The individual bonding wire 15 is made of material having excellent electrical conductivity. Examples of this material include gold, silver, copper, aluminum, and an alloy containing at least one kind of these elements. Some of the bonding wires 15 have a diameter between 110 μm and 200 μm, inclusive, for example. In addition, some other bonding wires 15 have a diameter between 350 μm and 500 μm, inclusive, for example.

The individual contact part 30 includes a cylindrical main body having a predetermined thickness, and a through-hole is formed in the main body. The contact part 30 also includes a flange circular in plan view at either end and around the corresponding opening of the main body. The individual contact part 30 is made of metal material having excellent electrical conductivity. Examples of this metal material include silver, copper, nickel, and an alloy containing at least one kind of these elements. To improve the corrosion resistance, plating may be performed on the front surface of the individual contact part 30. The plating material used in this plating is, for example, nickel, a nickel-phosphorus alloy, or a nickel-boron alloy. Regarding the individual contact part 30, the flange side at one end is bonded to the front surface of a corresponding circuit pattern 12 via the above bonding material.

The individual external connection terminal 31 is a press-fit terminal having a rod-like main body, a tapered tip portion formed at either end of the main body, and a thick part formed at an upper part of the main body. The main body is prismatic in shape. The length of a diagonal line on a cross section of the main body of the individual external connection terminal 31 is longer than the diameter of the main body of the individual contact part 30 by a few percent (%). Thus, the individual external connection terminal 31 is press-fitted into a corresponding contact part 30. The diameter of the thick part is larger than that of the main body. A convex member may integrally be attached to the main body and used as the external connection terminal 31 having the thick part. The individual external connection terminal 31 may also be made of metal material having excellent electrical conductivity. Examples of the metal material include silver, copper, nickel, and an alloy containing at least one kind of these elements. To improve the corrosion resistance, plating may be performed on the front surface of the individual external connection terminal 31. The plating material used in this plating is, for example, nickel, a nickel-phosphorus alloy, or a nickel-boron alloy. Terminals other than the press-fit terminals may be used as the external connection terminals 31. For example, approximately straight terminals, each of which has a main body that does not have a thick part, may be used. The sealing material 43 is more flexible than the buffer material 17. In addition, the sealing material 43 has an elastic modulus about several dozen megapascal (MPa) and a linear expansion coefficient between $100 \times 10^{-6}$ (1/° C.) and $300 \times 10^{-6}$ (1/° C.), inclusive. The sealing material 43 contains silicone gel as its main component.

The case 40 includes an outer periphery part 41 that surrounds the above-described components of the semiconductor device 50 and an upper lid part 42 that covers the upper part of the outer periphery part 41 and is integrally attached to the outer periphery part 41. The outer periphery part 41 has a shape of a box and approximately rectangular in plan view. Each of the four corners of the outer periphery part 41 in plan view has a fixing hole (not illustrated). These fixing holes extend from the front surface to the rear surface of the outer periphery part 41. A bottom part on the cross section of the outer periphery part 41 is processed to have an inverted L shape along the opening. The outer periphery part 41 is attached to the outer circumferential part of the ceramic board 11 of the ceramic circuit board 10 via the adhesive 16. In addition, a fixing part 44 is formed on a pair of opposite long sides of the outer periphery part 41. Each of these fixing parts 44 has a shape of an approximate flat plate and is formed to be on the same plane with the rear surface of the outer periphery part 41. Fixing holes 44a (see FIG. 11) are formed in the fixing parts 44. These fixing parts 44 are made of metal material, for example. For example, as illustrated in FIG. 3, the upper lid part 42 has the plurality of insertion holes 42a, through which the external connection terminals 31 are inserted. These insertion holes 42a are formed vertically and horizontally. By forming the insertion holes 42a in this way, the external connection terminals 31 formed at locations to suit to the semiconductor device 50 become insertable.

The case 40 is made of thermoplastic resin. The resin used is polyphenylene sulfide, polybutylene terephthalate resin, polybutylene succinate resin, polyamide resin, or acrylonitrile butadiene styrene resin, for example. The case 40, including the fixing parts 44, is formed by injection molding using thermally flexible resin.

As described above, to attach a heat radiation unit to the rear surface of the ceramic circuit board 10, heat-conductive materials (not illustrated) are formed to the rear surface. As described above, the individual heat-conductive material is TIM. For example, the heat-conductive materials are approximately regular hexagons in plan view and form a honeycomb pattern on the rear surface of the metal plate 13. When the heat-conductive materials are subsequently pressed by the heat radiation unit or the like, the sides of the individual regular hexagon are spread outward. Since the heat-conductive materials form a honeycomb pattern, neighboring heat-conductive materials evenly come into contact with each other, and the entire rear surface of the semiconductor device 50 is covered by the heat-conductive materials (see FIG. 11). The heat-conductive materials 14 illustrated in FIG. 11 cover the entire rear surface of the semiconductor device 50 after pressed as described above. In addition, the interval between heat-conductive materials in a honeycomb pattern is between 1.5 mm and 3.5 mm, inclusive. This interval is the interval between opposite sides of approximately regular hexagons. The individual heat-conductive material has a thickness between 200 µm and 250 µm, inclusive. In addition, by using a stencil mask corresponding to a shape of a pattern as descried above, the heat-conductive materials are applied to the rear surface of the ceramic circuit board 10.

In the case of the semiconductor device 50 having the above structure, a printed board may be attached to the external connection terminals 31, as needed. A printed board not illustrated includes an insulating plate and a plurality of upper circuit patterns formed on the front surface of the insulating plate. In addition, the printed board includes a plurality of lower circuit patterns on the rear surface of the insulating plate, as needed. The printed board has a plurality of through-holes that run from the front surface to the rear surface at the locations corresponding to the external connection terminals 31 of the semiconductor device 50. The thick parts of the external connection terminals 31 of the semiconductor device 50 are pressed into the through-holes of the printed board. Consequently, the printed board and the semiconductor device 50 are electrically connected to each other. For example, it is possible to input control signals to the semiconductor device 50 from the printed board via the external connection terminals 31.

Figure 5:
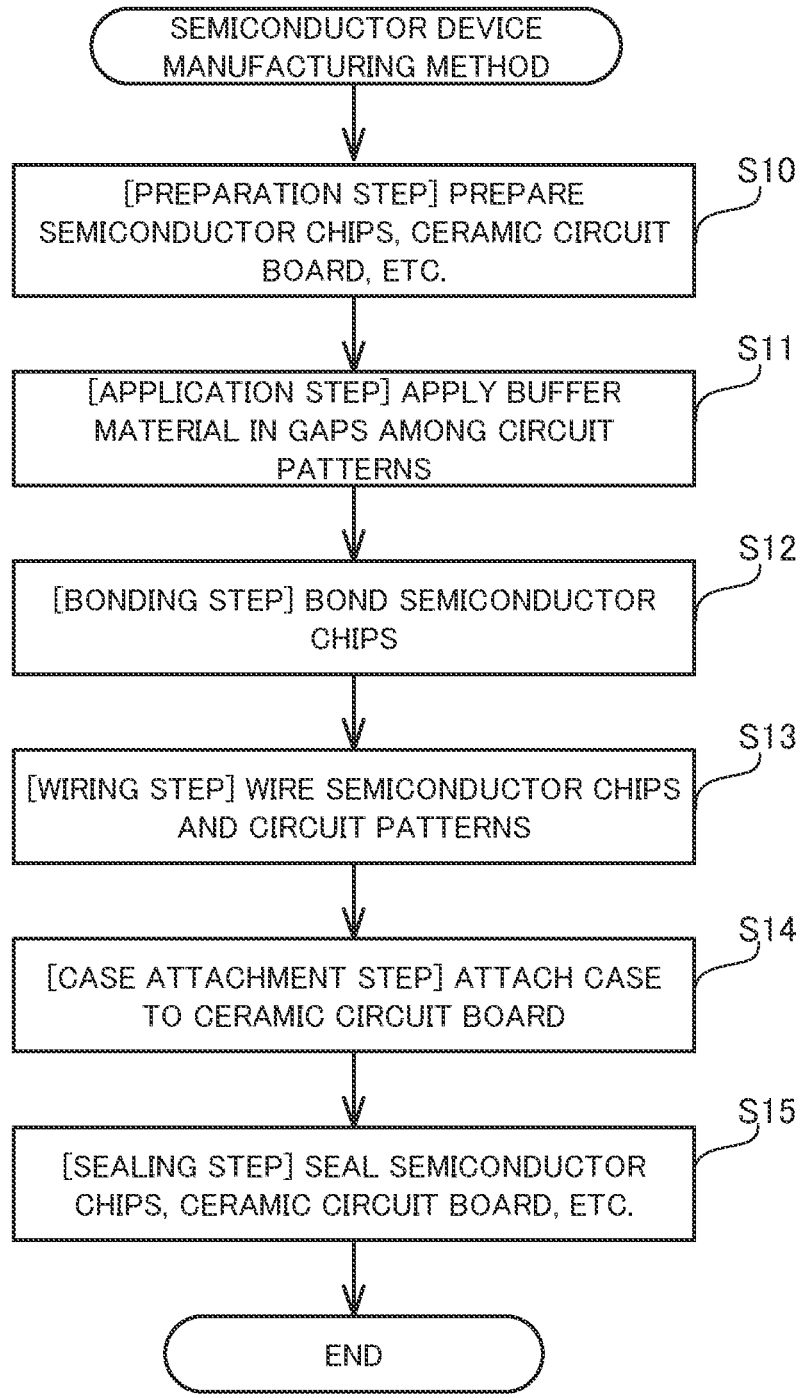
FIG. 5 is a flowchart illustrating a semiconductor device manufacturing method according to the second embodiment.
Figure 6:
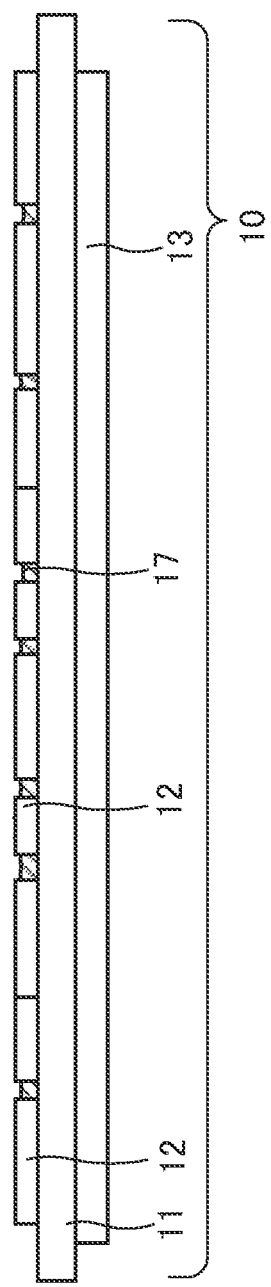
FIG. 6 is a sectional view illustrating an application step included in the semiconductor device manufacturing method according to the second embodiment.
Figure 7:
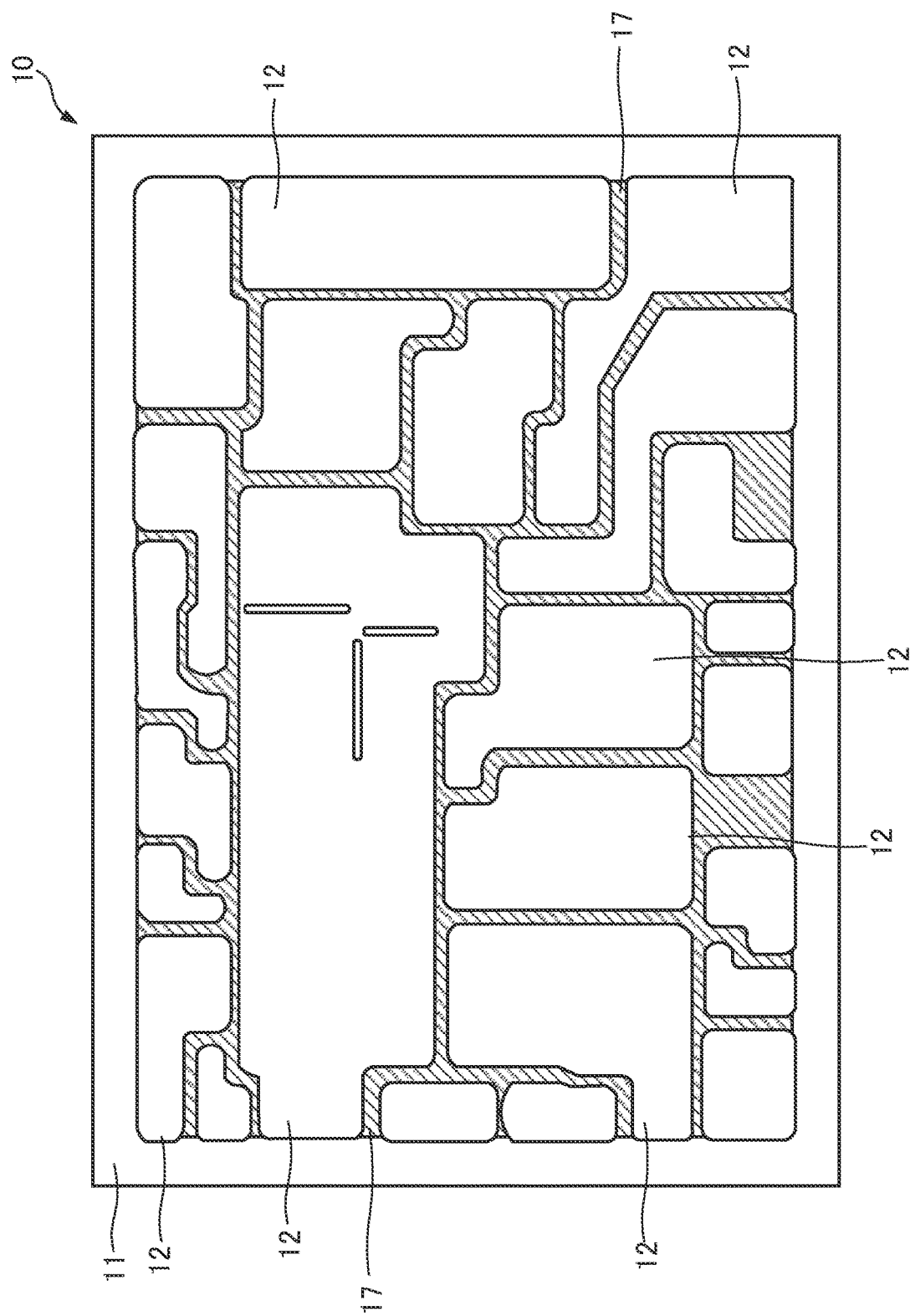
FIG. 7 is a plan view illustrating the application step included in the semiconductor device manufacturing method according to the second embodiment.

Next, a manufacturing method of the semiconductor device 50 will be described with reference to FIGS. 5 to 10. FIG. 5 is a flowchart illustrating a semiconductor device manufacturing method according to the second embodiment. FIG. 6 is a sectional view illustrating an application step included in the semiconductor device manufacturing method according to the second embodiment. FIG. 7 is a plan view illustrating the application step included in the semiconductor device manufacturing method according to the second embodiment.

Figure 8:
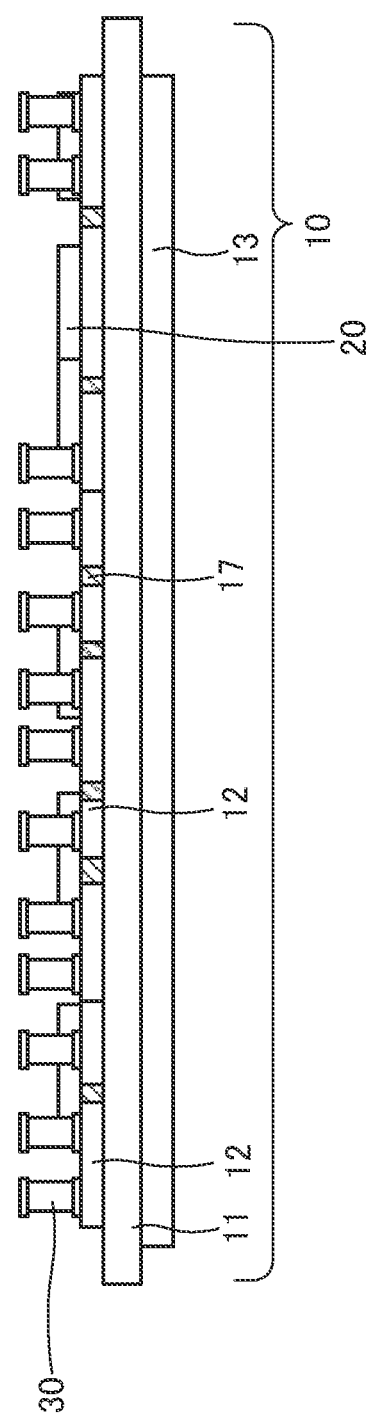
FIG. 8 is a sectional view illustrating a bonding step included in the semiconductor device manufacturing method according to the second embodiment.
Figure 9:
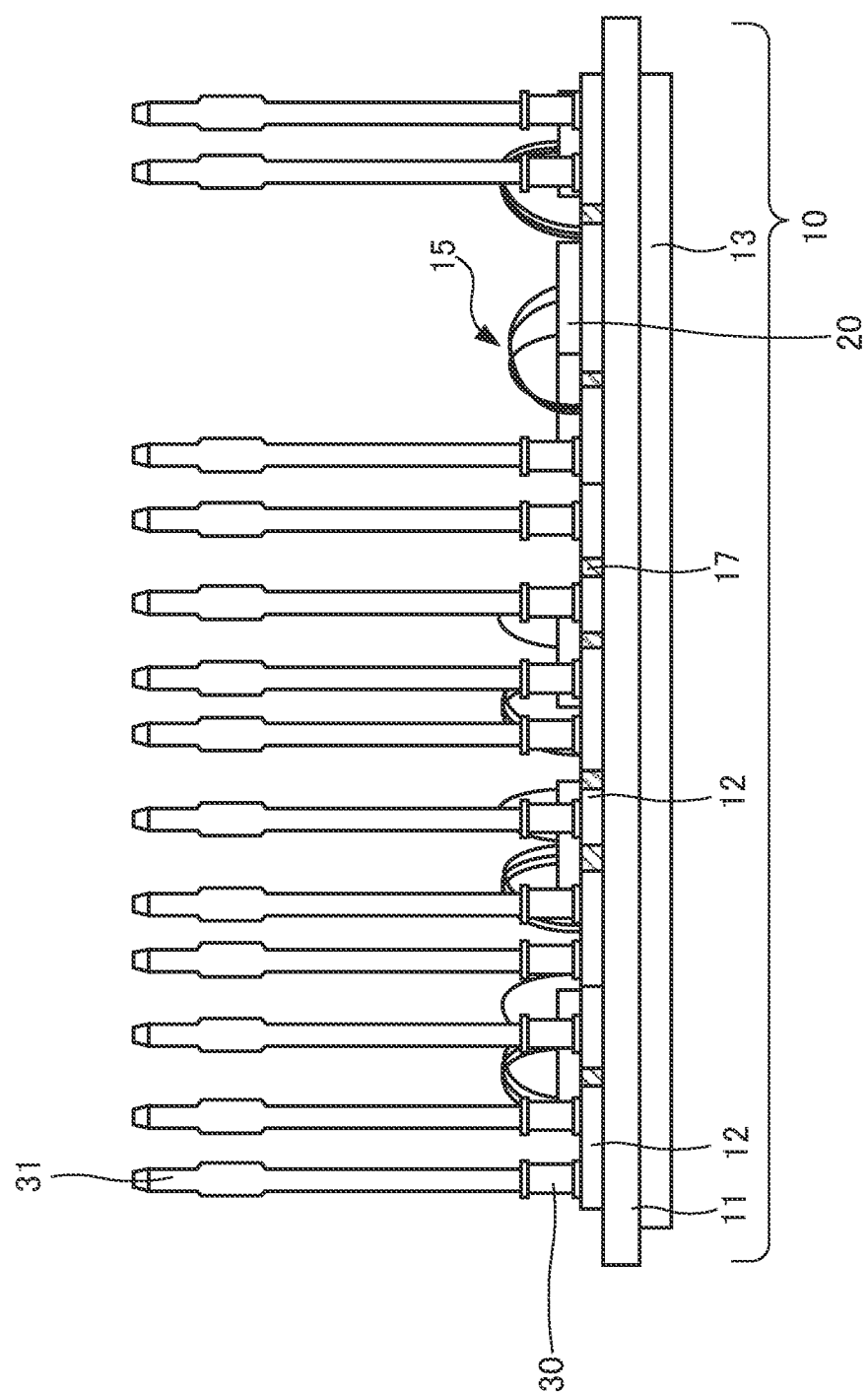
FIG. 9 is a sectional view illustrating a wiring step included in the semiconductor device manufacturing method according to the second embodiment.
Figure 10:
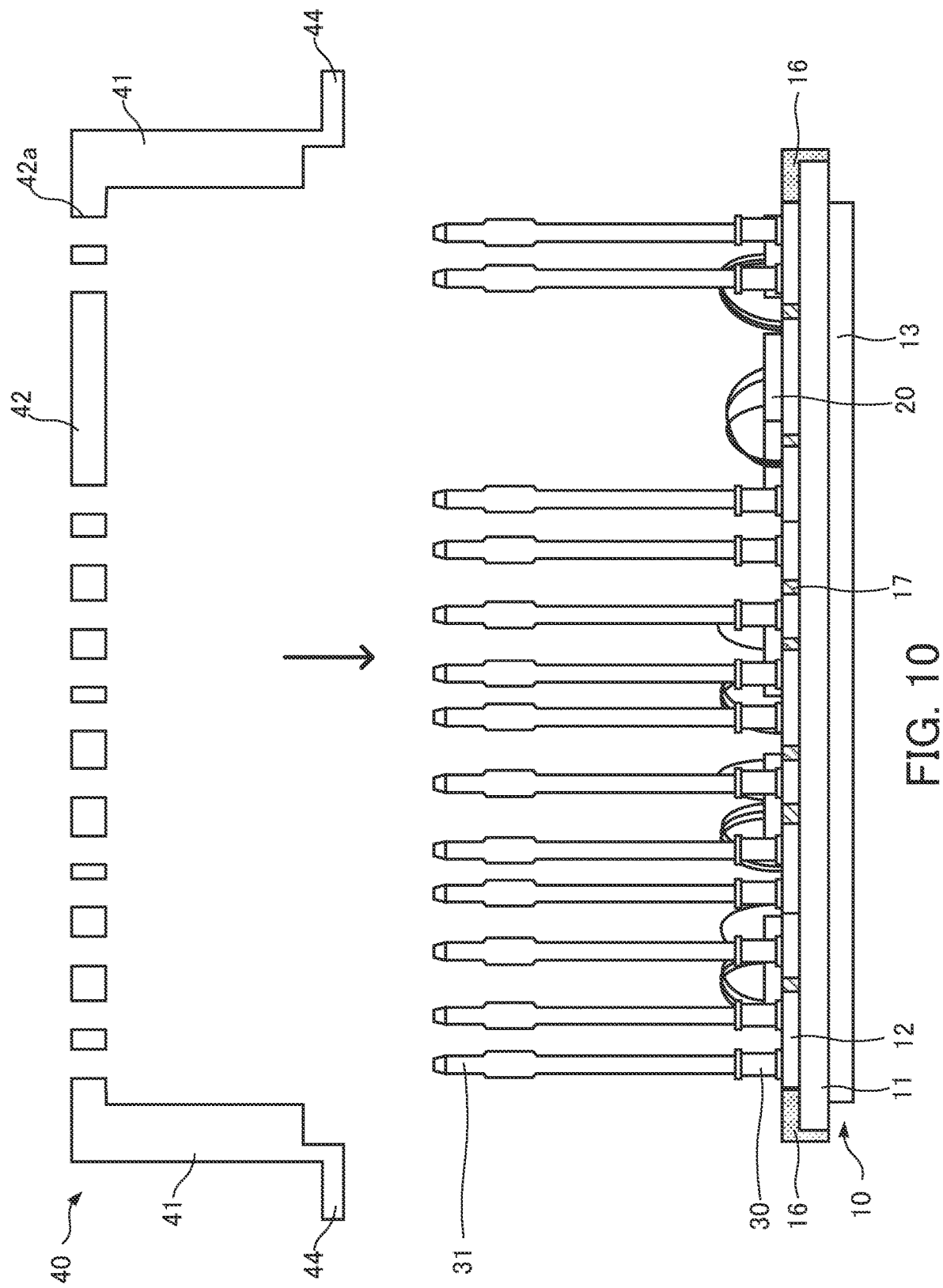
FIG. 10 is a sectional view illustrating a case attachment step included in the semiconductor device manufacturing method according to the second embodiment.

FIG. 8 is a sectional view illustrating a bonding step included in the semiconductor device manufacturing method according to the second embodiment. FIG. 9 is a sectional view illustrating a wiring step included in the semiconductor device manufacturing method according to the second embodiment. FIG. 10 is a sectional view illustrating a case attachment step included in the semiconductor device manufacturing method according to the second embodiment. The following manufacturing method is performed by a predetermined manufacturing apparatus. In the drawings used in the following description, there are cases in which the reference numerals of components that are not directly used in the description are omitted.

The preparation step (step S10 in FIG. 5) is performed to prepare the first and second semiconductor chips 20 and 21, the ceramic circuit board 10, the contact parts 30, the external connection terminals 31, the case 40, etc. Next, the application step (step S11 in FIG. 5) is performed to apply the buffer material 17 in the gaps among the plurality of circuit patterns 12 of the ceramic circuit board 10. Resin potting is performed to apply the buffer material 17, which has already been melted, in the gaps among the plurality of circuit patterns 12. Alternatively, a stencil mask in which an opening pattern corresponding to the gaps among the plurality of circuit patterns 12 is formed may be used to apply the buffer material 17. Alternatively, a dispenser may be used to apply the buffer material 17 in the gaps among the plurality of circuit patterns 12. It is desirable that the buffer material 17 be applied in the gaps among the plurality of circuit patterns 12 in such a manner that the buffer material 17 will not contain voids. When the buffer material 17 applied as described above is solidified, the semiconductor device 50 including the buffer material 17 applied in all the gaps among the plurality of circuit patterns 12 of the ceramic circuit board 10 as illustrated in FIGS. 6 and 7 is obtained. This application step is performed on the ceramic circuit board 10 at least before the bonding step and the wiring step to be described below. In particular, if this application step is performed after the wiring step is performed, it becomes difficult to apply the buffer material 17 in the gaps among the plurality of circuit patterns 12. By performing the application step at this timing, the buffer material 17 is appropriately applied in the gaps among the plurality of circuit patterns 12.

Next, the bonding step (step S12 in FIG. 5) is performed to bond the first and second semiconductor chips 20 and 21 to predetermined locations of the plurality of circuit patterns 12 via bonding material (not illustrated) Sintered body is used as the bonding material. In this bonding step, metal particulate powder is applied to the predetermined locations on the front surfaces of a plurality of circuit patterns 12, and bonding target components such as the first and second semiconductor chips 20 and 21 are disposed on the predetermined locations. While being heated at a predetermined sintering temperature, the bonding target components are pressed against the circuit patterns 12. Since the metal particulate powder is sintered, the bonding target components are bonded to the circuit patterns 12 via the sintered body. In this step, the sintering temperature is lower than the glass transition temperature of the buffer material 17. Thus, even when the first and second semiconductor chips 20 and 21 are heated to be bonded, the sintered body is sintered without melting the buffer material 17. In this bonding step, as illustrated in FIG. 8, the contact parts 30 may also be bonded as the bonding target components along with the first and second semiconductor chips 20 and 21. In this case, after the contact parts 30 are bonded, the external connection terminals 31 are press-fitted to the contact parts 30. Alternatively, without using the contact parts 30, the external connection terminals 31 as the bonding target components may directly be bonded to predetermined locations of the front surfaces of a plurality of circuit patterns 12 via sintered body.

Next, the wiring step (step S13 in FIG. 5) is performed to wire the first and second semiconductor chips 20 and 21 to each other, the plurality of circuit patterns 12 to each other, and the first and second semiconductor chips 20 and 21 and the plurality of circuit patterns 12 to each other. As illustrated in FIG. 9, the bonding wires 15 electrically connect suitable first and second semiconductor chips 20 and 21 to each other, suitable circuit patterns 12 to each other, and suitable first and second semiconductor chips 20 and 21 and suitable circuit patterns 12 to each other (see FIG. 4). When the external connection terminals 31 are press-fitted into the contact parts 30, the external connection terminals 31 may be press-fitted into the contact parts 30 after this wiring step. In this way, the wiring step will not be disrupted by the external connection terminals 31.

Next, a case attachment step (step S14 in FIG. 5) is performed to attach the case 40 to the ceramic circuit board 10. In this step, the adhesive 16 is applied to the area outside the whole circumferential part of the plurality of circuit patterns 12 on the ceramic board 11 of the ceramic circuit board 10 and the side surfaces of the ceramic board 11. Next, as illustrated in FIG. 10, the case 40 is lowered to the ceramic circuit board 10 from above. Accordingly, the external connection terminals 31 are inserted into the insertion holes 42a in the upper lid part 42 of the case 40, and the lower part of the outer periphery part 41 of the case 40 fits with the outer circumferential part of the ceramic board 11 of the ceramic circuit board 10 via the adhesive 16. After the case 40 is attached, the adhesive 16 is heated at a bonding temperature so that the adhesive 16 will be dried. While depending on the material of the adhesive 16, the bonding temperature is, for example, between 120° C. and 160° C., inclusive. In this way, the adhesive 16 is sandwiched by the side parts of the whole circumferential part of the plurality of circuit patterns 12 and the outer periphery part 41 of the case 40 (see FIG. 3). The adhesive 16 sandwiched as described above fixates the case 40 and the ceramic circuit board 10 and provides the same advantageous effects to the plurality of circuit patterns 12 as those provided by the buffer material 17. Thus, the adhesive 16 is applied to at least the outer corners of the plurality of circuit patterns 12, the outer corners facing the outer circumferential part of the ceramic board 11, and areas near the outer corners.

Next, the sealing step (step S15 in FIG. 5) is performed to seal the first and second semiconductor chips 20 and 21, the contact parts 30, the external connection terminals 31, and the bonding wires 15 on the ceramic circuit board 10 by injecting the sealing material 43 into the case 40 through a predetermined opening in the upper lid part 42 of the case 40. When this injection is performed, the adhesive 16 is heated at a temperature between 120° C. and 160° C., inclusive, for example. When this sealing material 43 injected as described above is cooled and solidified, the semiconductor device 50 illustrated in FIG. 3 is obtained.

Figure 11:
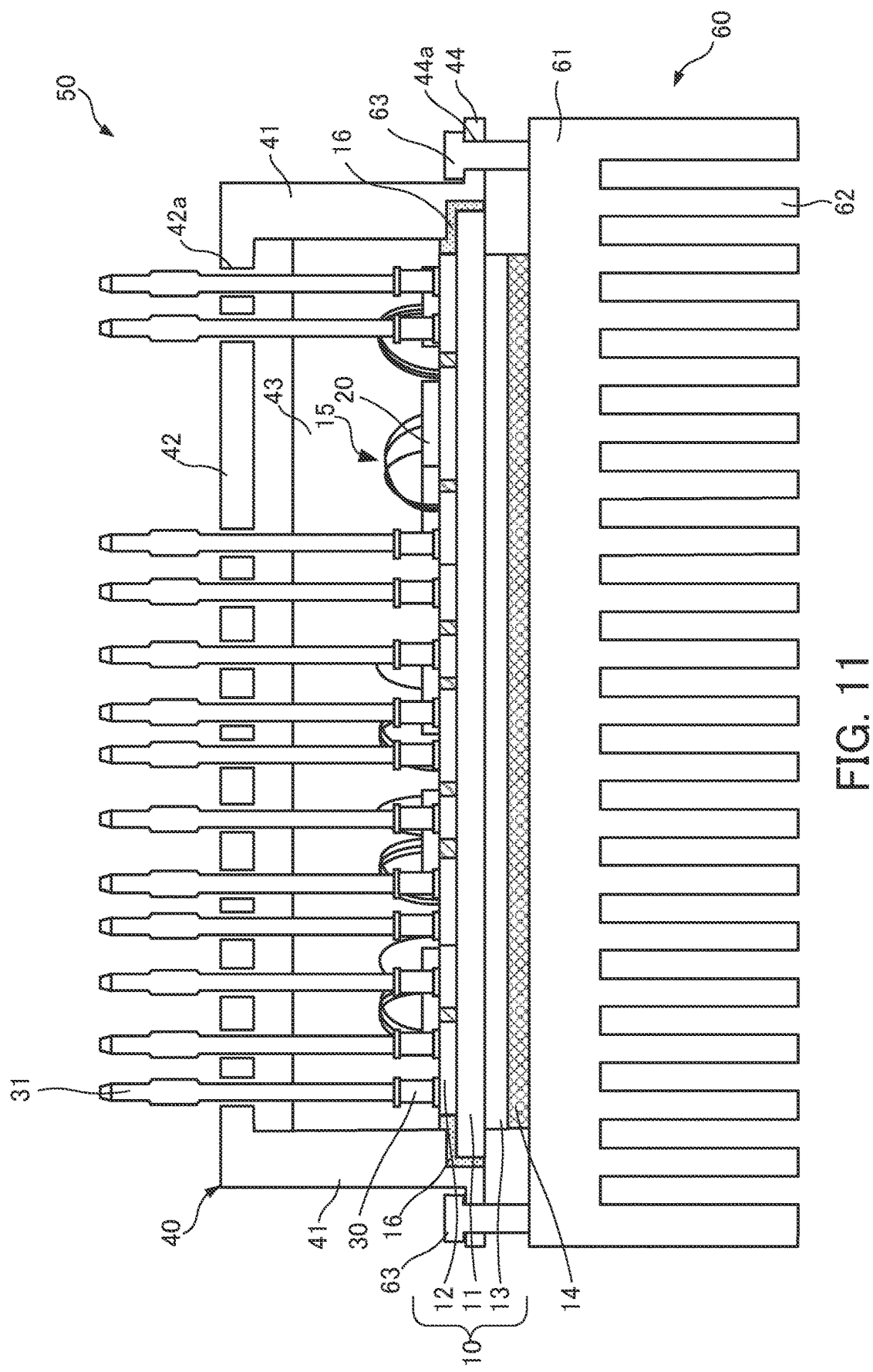
FIG. 11 is a sectional view of the semiconductor device according to the second embodiment to which a heat radiation unit is attached.

A heat radiation unit may be attached to the semiconductor device 50 obtained as described above. Next, attaching a heat radiation unit to the semiconductor device 50 will be described with reference to FIG. 11. FIG. 11 is a sectional view of the semiconductor device according to the second embodiment to which a heat radiation unit has been attached. A heat radiation unit has been attached to the semiconductor device 50. FIG. 11 illustrates a case in which a heatsink 60 is attached as a heat radiation unit on the rear surface of the semiconductor device 50. The heatsink 60 includes a heat radiation plate 61 and a plurality of fin parts 62 formed on a main surface of the heat radiation plate 61. The heatsink 60 is made of metal material having excellent thermal conductivity. Examples of the metal material include aluminum, iron, silver, copper, and an alloy containing at least one kind of these elements. To improve the corrosion resistance, plating may be performed on the front surface of the heatsink 60. The plating material used in this plating is, for example, nickel, a nickel-phosphorus alloy, or a nickel-boron alloy. In addition, other than the heatsink 60, the heat radiation unit may be a cooling plate or a cooling fin having a cooling mechanism.

Next, a method for attaching the heatsink 60 to the semiconductor device 50 will be described. First, a pattern of heat-conductive materials as described above is formed on the rear surface of the semiconductor device 50 (on the metal plate 13 of the ceramic circuit board 10). The main surface of the heat radiation plate 61 of the heatsink 60 is pressed against the rear surface, on which the heat-conductive materials are formed, of the semiconductor device 50. When the heat-conductive materials are pressed, the sides of the individual regular hexagon spread outward and are connected to other sides. As a result, the heat-conductive materials cover approximately the entire rear surface of the metal plate 13 of the ceramic circuit board 10. In this way, the heat-conductive materials 14 thinly spread between the rear surface of the semiconductor device 50 and the heatsink 60. In addition, the fixing holes 44a in the fixing parts 44 of the case 40 of the semiconductor device 50 and the heat radiation plate 61 of the heatsink 60 are fixed to each other with screws 63. When the heatsink 60 is attached to the rear surface of the semiconductor device 50 via the heat-conductive materials 14, the heat-conductive materials 14 thinly spread on the entire rear surface of the semiconductor device 50. As a result, since the heat released from the semiconductor device 50 is suitably transferred to the heatsink 60 via the heat-conductive materials 14 and is released by the heatsink 60, the heat radiation performance of the semiconductor device 50 is improved. In addition, when the heatsink 60 is fixed to the case 40 of the semiconductor device 50 with the screws 63, the case 40 and the heatsink 60 are firmly fixed to each other. As a result, the case 40 is firmly attached to the ceramic circuit board 10, and the strength of the semiconductor device 50 is improved.

In the case of the semiconductor device 50, the case 40 contains the first and second semiconductor chips 20 and 21 and the ceramic circuit board 10 and is sealed by the sealing material 43. The ceramic circuit board 10 includes the ceramic board 11, the plurality of circuit patterns 12, each of which is formed with a gap from the other circuit patterns 12 on the front surface of the ceramic board 11, and the metal plate 13 formed on the rear surface of the ceramic board 11. The buffer material 17 is applied in all the gaps. In addition, the adhesive 16 is applied between the whole circumferential part of the plurality of circuit patterns 12 and the outer periphery part 41 of the case 40. Thus, even when the heat generated by the first and second semiconductor chips 20 and 21 expands and contracts the plurality of circuit patterns 12, the resultant stress is buffered by the buffer material 17 and the adhesive 16. Therefore, occurrence of cracks in the ceramic board 11 is reduced.

In addition, the ceramic circuit board 10 having the front surface on which the bonding wires 15, etc. are formed is sealed by the sealing material 43 having an elastic modulus smaller than that of the buffer material 17. Thus, the sealing material 43 does not prevent the buffer material 17 from buffering the stress caused by the expansion and contraction of the plurality of circuit patterns 12. If the sealing material 43 is made of the same material as that of the buffer material 17, the sealing material 43 hardens and contracts due to the heat generated by the first and second semiconductors chips 20 and 21. As a result, the bonding wires 15 are subjected to stress. Thus, the bonding portions of the bonding wires 15 could be peeled or the bonding wires 15 could be disconnected. However, according to the present embodiment, since the sealing material 43 is made of material having an elastic modulus and a linear expansion coefficient smaller than those of the buffer material 17, even when the first and second semiconductor chips 20 and 21 generate heat, the sealing material 43 hardens and contracts less. Thus, even when the sealing material 43 hardens and contracts, for example, the occurrence of disconnection of the bonding wires 15 sealed by the sealing material 43 is reduced.

In addition, in the case of the semiconductor device 50, the outer periphery part 41 of the case 40 is fitted with the outer circumferential part of the ceramic circuit board 10. In addition, as needed, a heat radiation unit is attached to the rear surface of the semiconductor device 50 and is fixed to the fixing parts 44 of the case 40 with the screws 63. Thus, in the case of the semiconductor device 50, the ceramic circuit board 10 is firmly attached to the case 40. As a result, the strength of the semiconductor device 50 is improved. Thus, deterioration of the reliability of the semiconductor device 50 is reduced.

The embodiments provide a semiconductor device and a semiconductor device manufacturing method that prevent occurrence of damage on an insulating circuit board and deterioration in reliability.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
an insulating circuit board, including
an insulating plate having a circuit pattern area on a front surface thereof and an outer circumferential part surrounding the circuit pattern area on the front surface thereof in a plan view of the semiconductor device,
a plurality of circuit patterns disposed in the circuit pattern area on the front surface of the insulating plate, the plurality of circuit patterns being arranged to have a gap between any adjacent two of the circuit patterns, each circuit pattern having at least one corner, each corner being in a corner area that covers said each corner and a portion of each gap adjacent to said each corner, and
a buffer material containing resin, applied on the front surface of the insulating plate only in the circuit pattern area at at least one of the corner areas, to fill the gap in the at least one of the corner areas.

2. The semiconductor device according to claim 1, wherein the plurality of the corner areas at which the buffer material is applied are further inside the insulating circuit board than the rest of the corner areas.

3. The semiconductor device according to claim 2, further comprising
a semiconductor chip bonded to a front surface of one of the circuit patterns via a bonding material, wherein
the plurality of the corner areas at which the buffer material is applied cover one of the at least one corner of said one circuit pattern.

4. The semiconductor device according to claim 3, wherein the bonding material is a sintered body containing silver or copper, or an alloy containing at least one of silver or copper as a main component.

5. The semiconductor device according to claim 4, wherein the buffer material has a glass transition temperature that is 200° C. or higher, and a sintering temperature that is lower than the glass transition temperature.

6. The semiconductor device according to claim 3, further comprising a sealing material containing silicone gel as a main component, the sealing material sealing the front surface of the insulating circuit board with the semiconductor chip bonded thereto.

7. The semiconductor device according to claim 3, comprising a case that covers the plurality of circuit patterns and the semiconductor chip and that is attached to the outer circumferential part of the insulating plate.

8. The semiconductor device according to claim 7, wherein the case is attached to outermost ones of the corners of the plurality of circuit patterns and the corner areas corresponding thereto, via adhesive.

9. The semiconductor device according to claim 8, wherein the adhesive is applied to an entire area, on the front surface of the insulating plate, that is from the whole circumferential part of the plurality of circuit patterns, which is constituted by circumferential parts of the plurality of circuit patterns and faces the outer circumferential part of the insulating plate, to the outer circumferential part of the insulating plate.

10. The semiconductor device according to claim 1, wherein the buffer material is applied in all the gaps.

11. The semiconductor device according to claim 10, wherein the buffer material has a linear expansion coefficient between $12\times10^{-6}(1/°C.)$ and $14\times10^{-6}(1/°C.)$, inclusive, and the buffer material has an elastic modulus between 14 GPa and 20 GPa, inclusive.

12. The semiconductor device according to claim 8, wherein
the plurality of circuit patterns includes a plurality of outermost circuit patterns, each of which has at least one first side face facing the outer circumferential part and at least one second side face forming the gap,
the buffer material is in direct contact with the at least one second side face of each outermost circuit pattern, and
the adhesive is made of a material different from a material of the buffer material and is in direct contact with the at least one first side face of said each outermost circuit pattern.

13. The semiconductor device according to claim 12, wherein the adhesive is applied to an entire area of the outer circumferential part and the buffer material is applied to an entire area of the circuit pattern area other than areas where the plurality of circuit patterns are disposed, so that the adhesive and the buffer material are in direct contact with each other at a border between the circuit pattern area and the outer circumferential part on the front surface of the insulating plate.

* * * * *